United States Patent [19]

Carbajal, III et al.

[11] 3,724,065

[45] Apr. 3, 1973

[54] FABRICATION OF AN INSULATED GATE FIELD EFFECT TRANSISTOR DEVICE

[75] Inventors: Bernard G. Carbajal, III; William Milton Gosney, both of Richardson; Lou H. Hall, Dallas, all of Tex.

[73] Assignee: Texas Instruments Incorporated, Dallas, Tex.

[22] Filed: Oct. 1, 1970

[21] Appl. No.: 77,222

[52] U.S. Cl. ........................................29/571, 29/578
[51] Int. Cl. ..............................................B01j 17/00
[58] Field of Search ..............29/571, 578; 317/235 B

[56] References Cited

UNITED STATES PATENTS

| | | | |
|---|---|---|---|
| 3,566,517 | 3/1971 | Brown et al. | 29/571 |
| 3,475,234 | 10/1969 | Kerwin et al. | 148/187 |
| 3,479,234 | 11/1969 | Gray | 29/571 X |
| 3,604,107 | 9/1971 | Fassett | 29/571 |

*Primary Examiner*—Charles W. Lanham
*Assistant Examiner*—W. Tupman
*Attorney*—Samuel M. Mims, Jr., James O. Dixon, Andrew M. Hassell, Harold Levine, Melvin Sharp, Michael A. Sileo, Jr., Henry T. Olsen, John E. Vandigriff and Gary C. Honeycutt

[57] ABSTRACT

An insulated gate field effect transistor is fabricated by a sequence of steps beginning with the growth and patterning of a thick oxide layer on an n-type silicon wafer. A thin gate-dielectric film is then formed on the exposed silicon surface, followed by deposition and patterning of the gate electrode thereon. The excess gate dielectric is removed, using the electrode as an etch resistant mask, and the wafer is then covered with a boron-doped silane oxide diffusion source for the formation of p-type source and drain regions. The resulting self-aligned and passivated-gate structure is then provided with ohmic contacts to complete the device.

16 Claims, 4 Drawing Figures

INVENTORS
Bernard G. Carbajal, III
William M. Gosney
Lou H. Hall
BY Gary C. Honeycutt
ATTORNEY

FABRICATION OF AN INSULATED GATE FIELD EFFECT TRANSISTOR DEVICE

This invention relates generally to the fabrication of semiconductor devices and more particularly to the fabrication of a self-aligned, insulated gate field effect transistor, using a doped-oxide diffusion source for the formation of source and drain regions, and for the passivation of the gate dielectric.

Recent developments in the fabrication of insulated gate field effect devices have emphasized the need to avoid overlap between the gate electrodes and the source of drain regions, in order to reduce Miller-type capacitance and thereby increase the frequency range of the device. Various self-aligned gate technologies have been reported, including, for example, the use of a patterned gate electrode as a diffusion mask. While this approach has successfully reduced Miller-type capacitance, it has not provided adequate diffusion control, nor has it provided adequate gate insulation and passivation. Still further, metallization failures due to sharp oxide contours have not been overcome by existing technology.

It is an object of the present invention to provide an improved method for the fabrication of an insulated gate field effect device. More particularly, it is an object of the invention to provide an improved self-aligned gate technique, while at the same time maintaining adequate control over doping levels obtained in the formation of source and drain regions.

Moreover, it is an object of the invention to provide improved gate insulation and passivation in the fabrication of such devices, while minimizing the abruptness of oxide contours and thereby improving metallization yields.

The invention is embodied in a method for the fabrication of an insulated gate field effect device, beginning with the step of forming a thick insulative film on the surface of a monocrystalline semiconductor body of one conductivity type, followed by the step of selectively removing a portion of the film to expose an area of the semiconductor surface for the formation of active device regions.

A thin insulative film is then formed on the exposed area of the semiconductor surface, followed by the step of forming a first conductive layer on the thin insulative film. The conductive layer is then patterned by selective etching to form the gate electrode. Using the gate electrode as a mask, two separate portions of the underlying thin insulative film are then selectively removed to re-expose corresponding portions of the area initially exposed. A doped insulative film is then formed on the re-exposed areas, the doped film containing a suitable impurity for conversion of the re-exposed surface areas and underlying semiconductor regions to the opposite conductivity type.

The composite structure is then heated to a temperature sufficiently high to cause diffusion of the impurity from the doped film into the re-exposed surface regions, thereby converting the semiconductor regions to the opposite conductivity type. Three separate portions of the doped film are then selectively removed to provide separate access holes to each of said regions of opposite conductivity type, and to the remainder of the first conductive layer. A second conductive layer is then deposited and patterned on the structure to establish ohmic contact with each of the converted regions and the remaining portion of the first conductive layer, respectively.

In a preferred embodiment the thick insulative film is a thermallygrown silicon oxide film formed on the surface of a monocrystalline silicon body of n-type conductivity. The thick oxide layer is then patterned by selective etching to expose an area of the silicon surface wherein the source, drain and gate regions are to be located. The wafer is again subjected to thermal oxide growth for a time sufficient to form a silicon oxide film of 300–2,000 angstroms in thickness on the exposed area of the silicon surface. A refractory metal such as molybdenum, for example, is then deposited across the entire oxide surface, including both the thin and thick portions. Selective etching techniques are then employed to remove the metal layer except for that portion which is to serve as the gate electrode, which requires that it be centrally located on the thin oxide film. Then, using the gate electrode as a mask, the thin oxide film is completely removed except for that portion lying beneath the gate electrode.

A boron-doped silane oxide is then deposited on the wafer as a source of boron diffusion into the re-exposed areas of the silicon surface for conversion of the underlying surface regions to form the source and drain on opposite sides of the gate electrode. Preferably the doped oxide is covered with a layer of undoped silane oxide to prevent out-diffusion. Subsequently, because the boron-doped oxide etches slower than the undoped oxide, the graded impurity profile yields sloped edges upon removal of oxide to form windows for ohmic contact metallization. The composite structure is then heated to diffusion temperature of about 1,100° C., for example, to form the source and drain regions. Access windows are then selectively etched through the combined thicknesses of the undoped and doped oxide layers to provide access for the source, drain and gate contacts.

Preferably, the thin insulative film includes a first layers having a composition selected for compatibility with the semiconductor surface and a second layer having a composition selected for its ability to protect and passivate the first layer. For example, the combination of a silicon oxide layer covered with silicon nitride is particularly advantageous.

Figure 1:
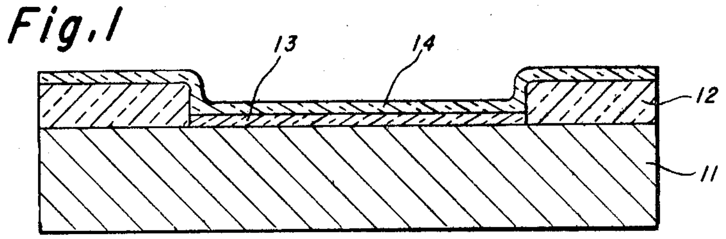
FIGS. 1, 2 and 3 are enlarged, cross-sectional views of a semiconductor wafer, illustrating various intermediate stages of a preferred embodiment of the process of the invention.

As shown in FIG. 1, monocrystalline silicon wafer 11 of n-type conductivity, having a resistivity of 4–6 ohm-centimeters, is subjected to steam oxidation for about one hour at 1,250° C., for example, thereby forming oxide layer 12 having a thickness of about 12,000 angstroms. A portion of layer 12 is removed by selective etching techniques to expose an area of the semiconductor surface corresponding to the combined area of the source, drain and gate regions to be fabricated therein.

The wafer is then returned to an oxidation furnace where it is subjected to a temperature of about 1,100°

C. in dry oxygen, for example, for a time of about 28 minutes sufficient to yield oxide layer 13 having a thickness of about 800 angstroms. In an alternate embodiment, layer 13 is grown by oxidation in steam at a temperature of 900° C. for about 10 minutes. Silicon nitride film 14 is then deposited over layers 12 and 13 by chemical vapor deposition. For example, silane is reacted with ammonia at a temperature of about 900° C. A gate conductor material is then deposited on silicon nitride layer 14. An electron-beam evaporated film of molybdenum has been found suitable, having a thickness of about 3,000 angstroms, for example. In an alternate embodiment polycrystalline silicon is deposited as the gate conductor material. Any conductive material is useful for this purpose, provided it can withstand the high temperature diffusion step which follows, and provided it can be patterned by selective etching techniques. Other useful metals include tungsten, tantalum and the metals of the platinum-paladium group.

The gate metal is then patterned, using known photolithographic techniques to remove all the metal except that portion which is to serve as the gate electrode.

Figure 2:
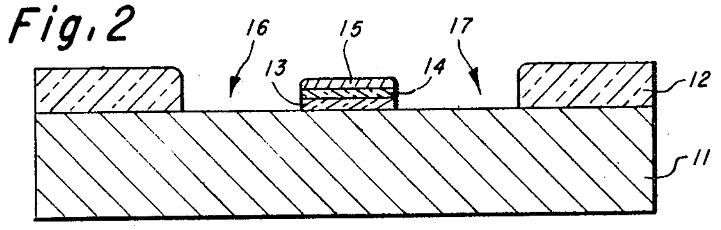

As shown in FIG. 2, gate electrode 15 is then employed as an etch resistant mask in the step of removing nitride layer 14 and oxide layer 13, thereby re-exposing silicon surfaces 16 and 17 wherein the source and drain regions are to be formed. A particularly desirable etching method to remove layers 14 and 13 is the use of a dilute aqueous solution of hydrofluoric acid at elevated temperature, preferably 0.5% HF at a temperature of 80°–90° C. It has been shown that such an etchant solution attacks silicon nitride and silicon oxide at substantially the same etch rate, thereby avoiding any substantial undercutting or shelving. In an alternate embodiment nitride layer 14 is removed with phosphoric acid, followed by removal of oxide layer 13 using a more concentrated HF solution.

Figure 3:
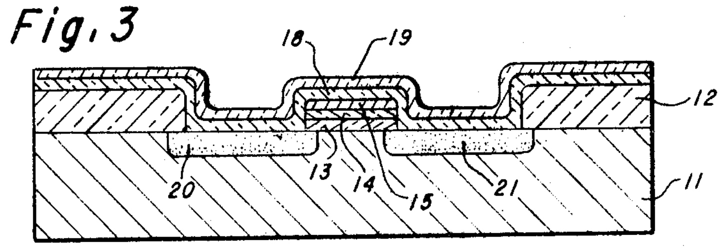

As shown in FIG. 3, the structure of FIG. 2 is then coated with a boron-doped silicon oxide layer 18 having a thickness of 1,000–2,000 angstroms, formed, for example, by the reaction of silane and borane with oxygen at a temperature of 300° to 450° C. Preferably, layer 18 is then covered with an undoped silane oxide cap having a thickness, for example, substantially equal to that of layer 18. The structure is then heated to diffusion temperature for a time sufficient to form the diffused source and drain regions 20 and 21. For example, the wafer is heated for one hour in nitrogen at about 1,100° C.

Figure 4:
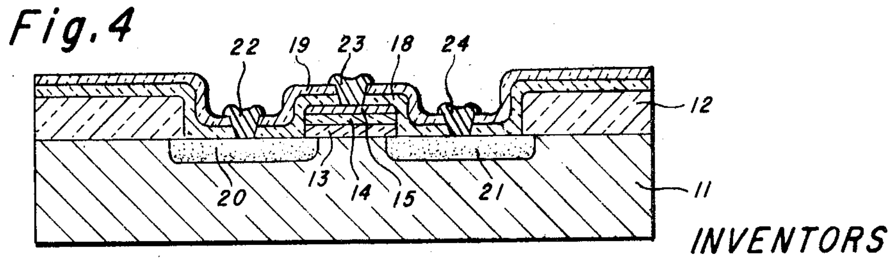
FIG. 4 is an enlarged, cross-sectional view of an insulated gate field effect transistor completed in accordance with the process embodiment of FIGS. 1–3.

As shown in FIG. 4, windows are then etched through layers 18 and 19 to provide access for metal contacts, followed by evaporation of a suitable conductor such as aluminum, for example, which is then patterned by selective etching to form ohmic contacts 22, 23 and 24 to the source, gate and drain regions, respectively, thereby completing the device.

Thus it will be apparent that the use of the foregoing method is particularly advantageous in that it not only provides for improved diffusion control in the formation of source and drain regions, but also provides complete passivation for the gate electrode and gate dielectric layers. Moreover, the combination of doped and undoped layers 18 and 19 inherently provides sloped edges upon selective etching to open contact windows. The sloped edges are advantageous in that they reduce the sharpness of oxide contours and thereby increase yields in the metallization step.

It will be apparent that an n-channel device is also within the scope of the invention. That is, by starting with a p-type wafer and diffusing n-type source and drain regions, an n-channel device is provided. In such an embodiment, oxide layer 18 is doped with phosphorus, for example, instead of boron.

An additional advantage of the present invention is the capability of providing a buried layer of metal interconnections at the time of patterning the gate electrode. That is, in the fabrication of an integrated circuit, portions of metal layer 15 are left on thick oxide 12 and subsequently covered by layers 18 and 19. A system of electrical interconnections is then made available by opening contact windows through oxide layers 18 and 19.

What is claimed is:

1. A method for the fabrication of an insulated gate field effect device comprising the steps of:

forming a thick insulative film on the surface of a monocrystalline semiconductor body of one conductivity type;

selectively removing a portion of said film to expose an area of said surface for the formation of a device;

forming a thin insulative film on said exposed area;

forming a first conductive layer on said thin insulative film;

selectively removing a portion of said first conductive layer and the underlying portions of said thin insulative film to re-expose corresponding portions of said exposed area;

forming a doped insulative film on said re-exposed areas, said doped film containing a suitable impurity for the conversion of said re-exposed areas and underlying surface semiconductor regions to the opposite conductivity type;

heating the composite structure to a temperature sufficiently high to cause diffusion of said impurity from the doped film into the re-exposed surface regions, thereby converting said regions to the opposite conductivity type; said doped insulative film exhibiting an impurity gradient subsequent to said diffusion selectively removing three separate portions of said doped film by etching with an etchant characterized by an etch rate which varies according to said impurity gradient thereby producing separate access holes to each of said regions of opposite conductivity type, and to the remainder of said first conductive layer said access holes having sloped sides produced responsive to said varying etch rate;

depositing and patterning a second conductive layer on said doped film to establish ohmic contact with each of said converted regions and the remaining portion of said first conductive layer, respectively.

2. A method as defined by claim 1 wherein said semiconductor is silicon.

3. A method as defined by claim 1 wherein said thin insulative film comprises a first layer having a composition selected for compatibility with the semiconductor surface and a second layer having a composition selected for its ability to protect and passivate said first layer.

4. A method as defined by claim 1 wherein said re-exposed areas of the semiconductor surface are symmetrically located on opposite sides of the remaining portion of said first conductive layer.

5. A method as defined by claim 1 including the step of covering said doped insulative film with an undoped insulative film to prevent out-diffusion.

6. A method as defined by claim 2 wherein said thick insulative film is a thermally-grown film of silicon oxide.

7. A method as defined by claim 6 wherein said thin insulative film is also thermally-grown silicon oxide.

8. A method as defined by claim 6 wherein said thin insulative film includes a thermally grown silicon oxide layer and a chemically vapor-deposited layer of silicon nitride.

9. A method as defined by claim 8 wherein said first conductive film is molybdenum.

10. A method as defined by claim 9 wherein the remaining portion of the molybdenum is used as an etch-resistant mask in removing the two separate portions of underlying thin insulative film.

11. A method as defined by claim 10 wherein the doped insulative film is a chemically vapor-deposited film of silicon oxide containing boron as said impurity therein.

12. A method as defined by claim 11 wherein the re-exposed areas of the silicon surface are symmetrically located on opposite sides of the remaining portion of the molybdenum.

13. A method as defined by claim 12 wherein the second conductive layer is aluminum.

14. A method as defined by claim 1 wherein an n-channel device is produced.

15. A method as defined by claim 1 wherein a p-channel device is produced.

16. A method for the fabrication of an insulated gate field effect device having completely passivated source, drain and gate elctrodes comprising the steps of:

forming a thick insulative film on the surface of a monocrystalline semiconductor body of one conductivity type;

selectively removing a portion of said film to expose an area of said surface for the formation of a device;

forming a thin insulative film on said exposed area;

forming a first conductive layer on said thin insulative film;

selectively removing a portion of said first conductive layer and the underlying portions of said thin insulative film to re-espose corresponding portions of said exposed area;

forming a doped insulative film on said re-exposed areas, said doped film containing a suitable impurity for the conversion of said re-exposed areas and underlying surface semiconductor regions to the opposite conductivity type;

forming an undoped insulative film over said doped film, said undoped film having different etch characteristics than said doped film;

heating the composite structure to a temperature sufficiently high to cause diffusion of said impurity from the doped film into the re-exposed surface regions, thereby converting said regions to the opposite conductivity type said undoped film effectively preventing outdiffusion, said heating producing an impurity gradient through the thickness of said doped and undoped films;

selectively removing three separate portions of said doped and undoped films by etching with an etchant characterized by an etch rate which varies according to the impurity concentration, thereby producing separate access holes to each of said regions of opposite conductivity type, and to the remainder of said first conductivie layer said access holes having sloped sides produced responsive, to said varying etch rate; and depositing and patterning a second conductive layer on said doped film to establish ohmic contact with each of said converted regions and the remaining portion of said first conductive layer, respectively.

* * * * *